US007388520B2

(12) United States Patent
Kim

(10) Patent No.: US 7,388,520 B2
(45) Date of Patent: Jun. 17, 2008

(54) APPARATUS AND METHOD FOR DECODING A KEY PRESS

(75) Inventor: Jae-Cheol Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 116 days.

(21) Appl. No.: 11/312,517

(22) Filed: Dec. 21, 2005

(65) Prior Publication Data

US 2006/0132331 A1 Jun. 22, 2006

(30) Foreign Application Priority Data

Dec. 22, 2004 (KR) ..................... 10-2004-0110662

(51) Int. Cl.
*H03M 11/00* (2006.01)

(52) U.S. Cl. ........................................ 341/26; 345/168

(58) Field of Classification Search .................. 341/20, 341/22, 26; 345/168

See application file for complete search history.

(56) References Cited

U.S. PATENT DOCUMENTS

| | | | | |
|---|---|---|---|---|
| 5,760,714 | A * | 6/1998 | Zimmerman ................. | 341/26 |
| 6,509,846 | B1 | 1/2003 | Fujiki | |
| 2002/0118178 | A1 | 8/2002 | O'Conghaile et al. | |
| 2004/0075649 | A1 | 4/2004 | Peng et al. | |

FOREIGN PATENT DOCUMENTS

| | | |
|---|---|---|
| JP | 57-197637 | 12/1982 |
| JP | 2003 177859 | 6/2003 |
| JP | 2003-186607 | 7/2003 |
| KR | 0200489 | 8/1997 |
| KR | 10-2004 0010910 | 2/2004 |

OTHER PUBLICATIONS

English language Abstract of Korean 10-2004-0010910.
English Language Abstract of JP 2003-18662607.
English Language Abstract of KR 0200489.
English Language Abstract of JP 57-197637.
English Language Abstract of JP 2003-177859.

* cited by examiner

*Primary Examiner*—Albert K. Wong
(74) *Attorney, Agent, or Firm*—Greenblum & Bernstein, P.L.C.

(57) ABSTRACT

Disclosed is an apparatus for decoding a key press. The apparatus includes an interface that performs conversion between parallel data and serial data and generates an interrupt when a key is pressed. The interface includes an output port, an input port, and a register. The apparatus also includes a key input unit, including a plurality of keys, that connects the output port to the input port, and a controller that determines which of the plurality of keys is pressed by receiving an interrupt signal from the interface via an interrupt pin, accessing the register via a plurality of address pins, and receiving serial data from the interface via a data pin.

28 Claims, 3 Drawing Sheets

| OUTPUT PIN | INITIAL OUTPUT PARALLEL DATA (A) | INPUT PIN | INITAL INPUT PARALLEL DATA (B) | INPUT PIN | INPUT PARALLEL DATA WHEN ($I/O_0$,$I/O_9$) KEY IS INFUTTED (C) |
|---|---|---|---|---|---|
| $I/O_0$ | 1111 | $I/O_8$ | 0000 | $I/O_8$ | 0000 |
| $I/O_1$ | 1111 | $I/O_9$ | 0000 | $I/O_9$ | 1111 |
| $I/O_2$ | 1111 | $I/O_{10}$ | 0000 | $I/O_{10}$ | 0000 |
| $I/O_3$ | 1111 | $I/O_{11}$ | 0000 | $I/O_{11}$ | 0000 |
| $I/O_4$ | 1111 | $I/O_{12}$ | 0000 | $I/O_{12}$ | 0000 |
| $I/O_5$ | 1111 | $I/O_{13}$ | 0000 | $I/O_{13}$ | 0000 |
| $I/O_6$ | 1111 | $I/O_{14}$ | 0000 | $I/O_{14}$ | 0000 |
| $I/O_7$ | 1111 | $I/O_{15}$ | 0000 | $I/O_{15}$ | 0000 |

APPARATUS AND METHOD FOR DECODING A KEY PRESS

This application claims the benefit of Korean Application No. 10-2004-110662, filed on Dec. 22, 2004, which is hereby incorporated by reference in its entirety

BACKGROUND OF THE INVENTION

1. Field of the Invention

The present invention relates to key input units, and more particularly, to an apparatus and method for decoding a key press.

2. Description of the Related Art

FIG. 1 illustrates the construction of a general apparatus for decoding a key press.

As shown in FIG. 1, a conventional apparatus for decoding a key press includes a controller 10 having an output unit with a certain number of output pins (KBC_0-KBC_4) for outputting a signal and an input unit with a certain number of input pins (KBR_0-KBR_4) for receiving a signal, and a key input unit 20 for connecting one of the output pins to one of the input pins when a key is pressed by a user.

The output pins and the input pins connect to the key input unit 20 in a matrix arrangement. The key input unit 20 includes a plurality of switches, corresponding to keys or push-buttons, which connect the output pins to the input pins.

The key press decoding apparatus constructed as described above operates as follows.

The controller 10 outputs signals through the output pins (KBC_0-KBC_4) of the output unit. In a condition in which no keys are pressed, no output signals are connected to any of the input pins (KBR_0-KBR_4) of the input unit, and a low level signal is applied to each of the input pins.

When a key of the key input unit 20 is pressed, a corresponding switch connects one of the output pins to one of the input pins. This pulls the output signal of the output pin connected to the pressed key to a low level, which causes an interrupt to be generated by the controller. When the interrupt is generated, the controller 10 determines which of the output pins is at the low level, in order to determine which of the output pins connects to the pressed key.

The controller 10 then determines which input pin is connected to the pressed key, by determining which input pin connects to the determined output pin. To do this, the controller changes the signal of each input pin, one by one, and determines which input pin causes a signal of the determined output pin to change. Since there are five input pins (KBR_0-KBR_4) and five output pins (KBC_0-KBC_4), this requires the controller 10 to examine up to 25 combinations of pins.

If the key input unit 20 includes 25 keys arranged in a 5×5 matrix, the controller 10 must have 10 pins (five input pins and five output pins). However, if one expands the number of keys, more controller pins are required. For example, if a key input unit 20 include 64 keys arranged in a 8×8 matrix, the controller 10 must have 16 pins (eight input pins and eight output pins).

As technology advances, many electronic devices, such as mobile terminals, are being provided with a greater number of features, and there is a corresponding need to increase the number of keys, or buttons, on these electronic devices. As discussed above, expanding the number of keys of a key input unit requires more controller pins. However, increasing the number of pins on a controller carries with it degraded performance of the controller. Further, if more pins of a controller are allocated for a key input unit, this takes away from the number of pins available for other functions.

SUMMARY OF THE INVENTION

In view of the foregoing, the present invention, through one or more of its various aspects, embodiments, and/or specific features or sub-components, is thus intended to bring out one or more of the advantages as specifically noted below.

An object of the present invention is to provide an apparatus and method for decoding a key press which allows the use of a large number of keys without requiring a large number of controller pins.

To achieve at least the above objects in whole or in part, there is provided an apparatus for decoding a key press which includes an interface that performs conversion between parallel data and serial data and generates an interrupt when a key is pressed. The interface includes an output port, an input port, and a register. The apparatus also includes a key input unit, including a plurality of keys, that connects the output port to the input port, and a controller that determines which of the plurality of keys is pressed by receiving an interrupt signal from the interface via an interrupt pin, accessing the register via a plurality of address pins, and receiving serial data from the interface via a data pin.

The register stores serial data received from the controller as parallel data at an address designated by the controller via the plurality of address pins, and converts parallel data into serial data under the control of the controller, the output port outputs parallel data from the register to the key input unit, and the input port inputs parallel data from the key input unit to the register.

The interface includes a first transistor that generates the interrupt signal when one of the plurality of keys is pressed. The first transistor generates the interrupt signal in response to a change of parallel data received by the input port from the key input unit.

The apparatus also includes an input filter that filters serial data transmitted from the controller and transmits it to the register, a second transistor that transmits serial data read from the register to the controller, and a power controller that turns power of the interface system on and off, and resets the interface system.

The output port and the input port may be input/output ports, and the controller may transmit and receive serial data to and from the interface according to one of an Inter-Integrated Circuit standard, a micro-WIRE standard and another serial communication method.

Parallel data is inputted to the register via the input port when the key is pressed and converted to serial data, and when the controller receives the interrupt signal, the controller accesses the register of the interface via the plurality of address pins, reads the converted serial data via the data pin, and compares the read serial data with previously stored serial data to thereby determine which input pin of a plurality of input pins of the input port connects to the pressed key.

The controller determines which output pin of a plurality of output pins of the output port connects to the pressed key by repeating a sequence which includes causing the register to output a data sequence to one output pin of the plurality of output pins at a time, reading serial data converted from parallel data input to the register via the input port, and determining whether serial data has changed as a result of outputting the data sequence to the one output pin.

The controller includes a plurality of pins, which may consist of three address pins, one or two data pins, and one interrupt pin. The interface may include a chip, and the key input unit may be part of one of a mobile terminal, a telephone, a computer, and a portable music player.

According to another aspect of the invention, there is provided a method for decoding a key press, which includes receiving, by a controller, an interrupt signal from an interface, reading, by the controller, serial data from the interface via a data pin, in response to receiving the interrupt signal, determining which input pin of a plurality of input pins is connected to a pressed key of a key input unit by comparing the read serial data with previously stored serial data, and determining which output pin of a plurality of output pins is connected to the pressed key of the key input unit by repeating a sequence comprising causing the interface to output a data sequence to one output pin of the plurality of output pins at a time. The interface outputs the interrupt signal when a key of the key input unit is pressed.

The method may also include outputting, by the controller, initialization serial data via the data pin to the interface and an address through an address pin to the interface, storing the initialization serial data as initialization parallel data in a register of the interface at a location corresponding to the address, and outputting the initialization parallel data to the key input unit through an output port.

Pressing a key of the key input unit connects an output pin of the plurality of output pins to an input pin of the plurality of input pins, thereby inputting parallel data output from the output pin to the input pin, and the interface sends the interrupt signal to the controller when new parallel data is inputted to the input pin.

Determining which output pin of a plurality of output pins is connected to the pressed key of the key input unit also includes reading serial data converted from parallel data input to a register of the interface via the input pins, and determining whether serial data has changed as a result of outputting the data sequence to the one output pin. The controller may transmit and receive serial data to and from the interface according to one of an Inter-Integrated Circuit standard, a micro-WIRE standard and another serial communication method.

The interrupt signal indicates to the controller that a key has been pressed, the interface may include a chip, and the key input unit may be part of one of a mobile terminal, a telephone, a computer, and a portable music player.

According to another aspect of the invention, there is provided an apparatus for decoding a key press, which includes an interface that performs conversion between parallel data and serial data, a key input unit, including a plurality of keys, and a controller that determines which of the plurality of keys is pressed. The interface exchanges serial data with the controller, and exchanges parallel data with the key input unit.

The interface includes a register that stores serial data received from the controller as parallel data, and stores parallel data received from the key input unit. The interface generates an interrupt signal and transmits the interrupt signal to the controller when a key is pressed. The controller determines which of the plurality of keys is pressed in response to receiving the interrupt signal from the interface.

According to another aspect of the invention, there is provided a method for decoding a key press, which includes receiving, by an interface, parallel data from a key input unit, converting the parallel data to serial data, transmitting the serial data to a controller, and determining, by the controller, which key of a plurality of keys of the key input unit is pressed.

The method may also include storing the parallel data received from the key input unit in a register, converting serial data transmitted by the controller to the interface to parallel data, and storing the converted parallel data in the register. The method may also include generating, by the interface, an interrupt signal and transmitting the interrupt signal to the controller when a key is pressed. The controller determines which of the plurality of keys is pressed in response to receiving the interrupt signal from the interface.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The present invention is further described in the detailed description that follows, by reference to the noted drawings by way of non-limiting examples of embodiments of the present invention, in which like reference numerals represent similar parts throughout several views of the drawings, and in which:

FIG. 3 illustrates a table of input and output data according to one embodiment of the present invention.

DETAILED DESCRIPTION OF THE PREFERRED EMBODIMENTS

Disclosed herein is an interface, which is arranged to be provided between a controller and a key input unit. The key input unit is an input unit which may be provided in a variety of different electronic devices, such as, but not limited to, a mobile terminal, a telephone, a computer, a portable music player, or any other suitable electronic device which utilizes a matrix of keys, buttons, switches or the like. The interface communicates serial data to and from the controller, and communicates parallel data to and from the key input unit, and allows the controller to decode a key press of the key input unit with a minimum number of controller pins.

Figure 1:
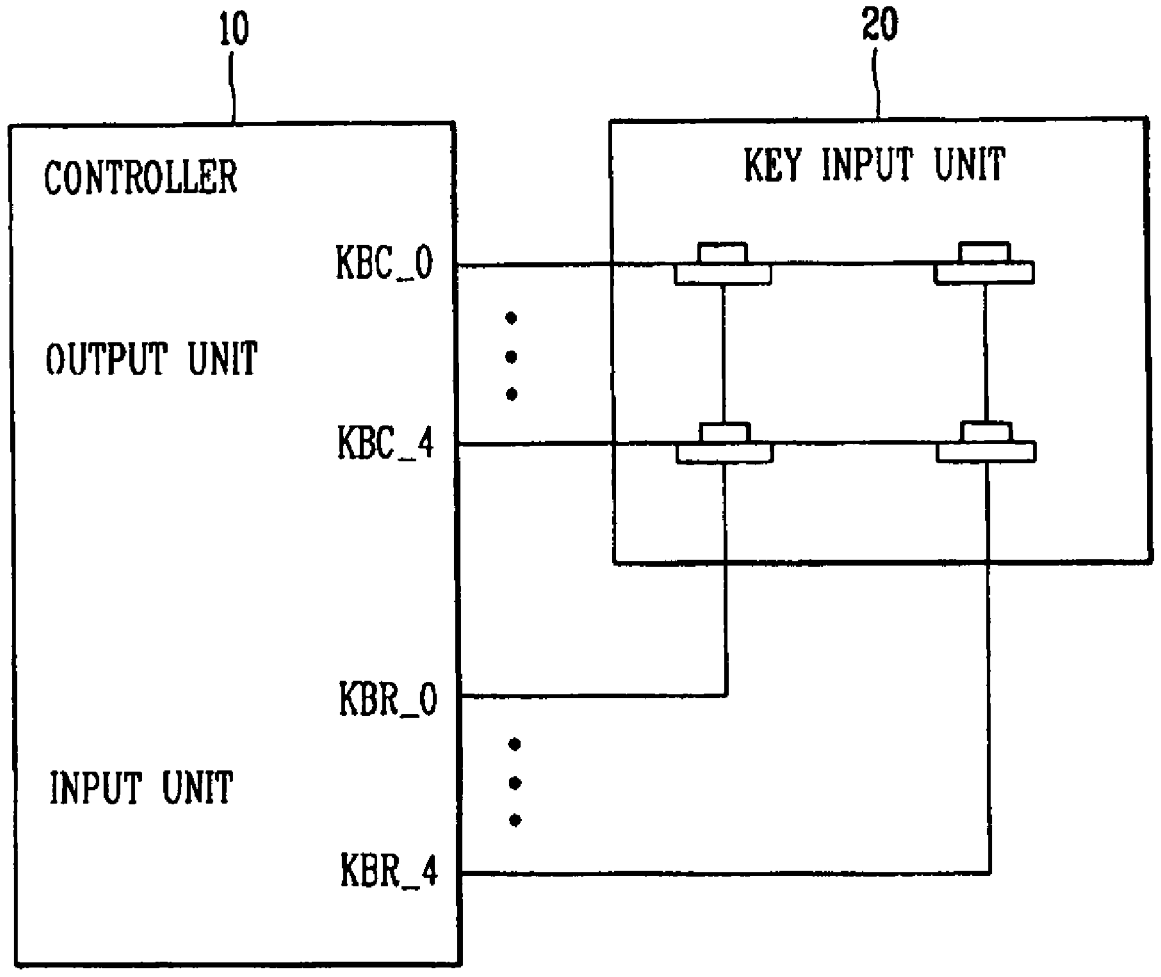
FIG. 1 illustrates the construction of a related art apparatus for decoding a key press.
Figure 2:
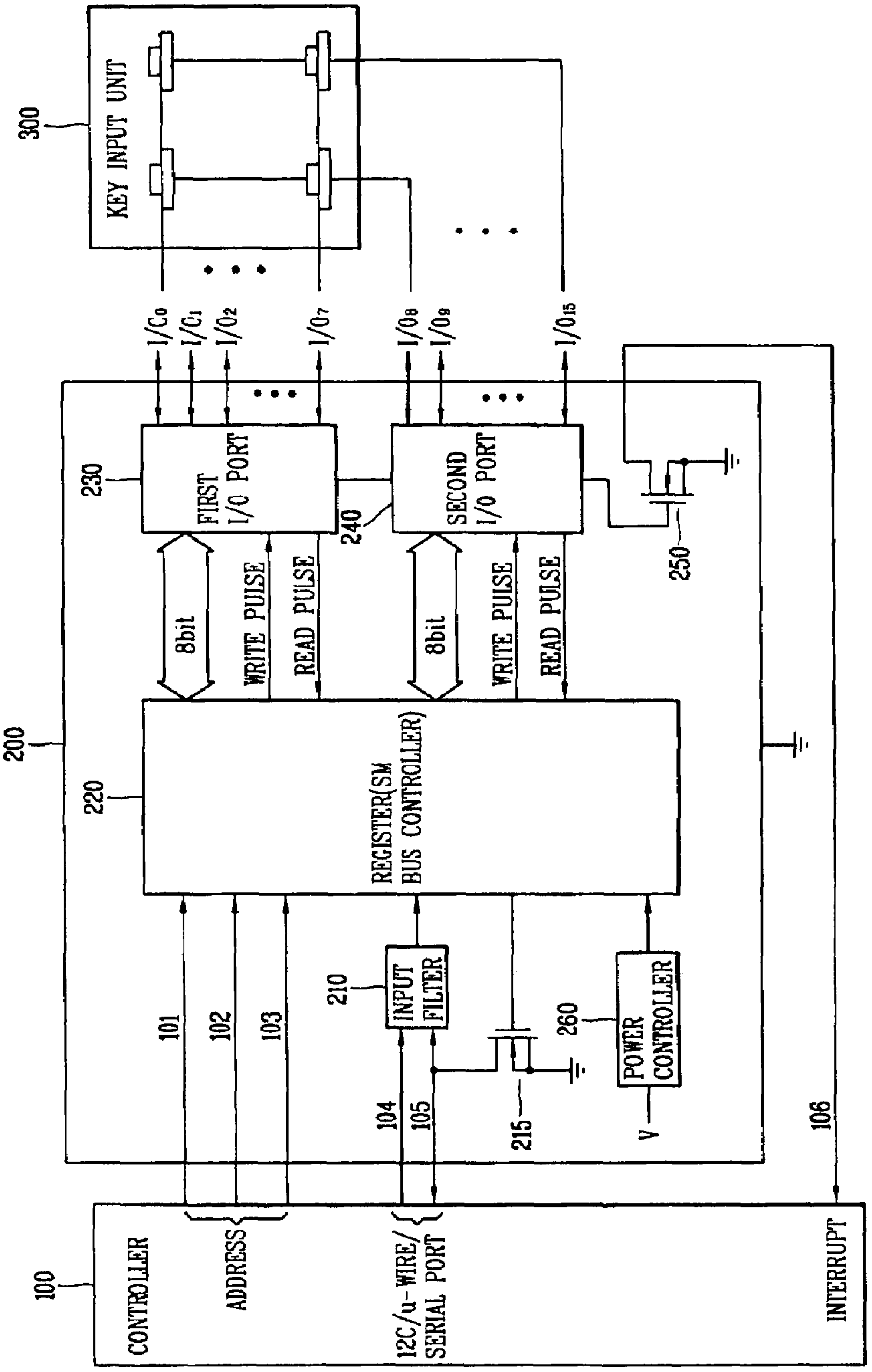
FIG. 2 illustrates the construction of an apparatus for decoding a key press according to one embodiment of the present invention.

FIG. 2 illustrates the construction of an apparatus for decoding key presses according to an embodiment of the invention. Although the present disclosure refers to a key press operation, the present invention is not limited solely to this type of input operation, but also encompasses other types of input operations as well, such as, but not limited to, switching a switch, or touching a touchpad.

The apparatus includes: an interface system 200 for performing conversion between parallel data and serial data and generating an interrupt when a key is pressed; a key input unit 300 (such as, for example, a key input unit used with a mobile terminal) for connecting an output port to an input port of the interface system 200 when a key is pressed by a user; and a controller 100 for recognizing which key is pressed. In the embodiment illustrated in FIG. 2, the controller 100 uses three address pins 101-103 to access a register 220 of the interface system 200, two data pins 104 and 105 to transmit and receive serial data with the interface system 200, and one interrupt pin 106 to receive an interrupt; however, the number of address pins, data pins and interrupt pins may be other than those specified above. The serial data may be transmitted to and from the interface 200 via the data pins 104 and 105 according to the Inter-Integrated Circuit ($I^2C$) standard, the micro-WIRE standard, or any other suitable serial communication method.

The interface system 200 may be implemented, for example, on a chip, and includes: an input filter 210 for filtering the serial data transmitted from the controller 100; a register 220 for storing the serial data received from the input filter 210 as parallel data at an address outputted from the controller 100 and for converting parallel data into serial data under the control of the controller 100; a first input/output port 230 for transmitting and receiving parallel data to and from the register 220; a second input/output port 240 for transmitting and receiving parallel data to and from the register 220; a first transistor 250 for generating an interrupt when a key of the key input unit 300 is pressed; a second transistor 215 for transmitting serial data from the register 220 to the controller 100; and a power controller 260 for turning power of the interface system 200 on and off and resetting the interface system 200. In this embodiment, one of the input/output ports 230, 240 functions as an input port, and the other functions as an output port.

The keys of the key input unit 300 are arranged in a matrix format, such that they are arranged in rows and columns. The first input/output port 230 is provided with a plurality of pins ($I/O_0$-$I/O_7$), and the second input/output port 240 is also provided with a plurality of pins ($I/O_8$-$I/O_{15}$). As shown in FIG. 2, each row of keys connects to a pin of the first input/output port 230, and each column of keys connects to a pin of the second input/output port 240.

The apparatus for decoding a key press constructed as described above operates as follows.

According to the exemplary embodiment illustrated in FIG. 2, the key input unit 300 includes 64 keys, arranged in an 8×8 matrix; thus, the first and second input/output ports 230 and 240 each include 8 pins. However, the present invention is not limited to any particular number of keys. For example, the input unit 300 may include 56 keys, arranged in an 7×8 matrix, if desired.

First, the controller 100 outputs initial serial data to the interface system 200 via serial pins 104 and 105, and outputs a designated register address, at which the serial data is to be stored, to the interface system 200 through the address line pins 101-103. Serial pins 104 and 105 are part of a serial port, such as, but not limited to, an $I^2C$ port or a micro-WIRE port.

The interface 200 converts the serial data to parallel data and stores the parallel data in the register 220 at the address designated by the controller 100. One of the input/output ports 230, 240 is set as an output port, and the other is set as an input port. In the exemplary embodiment described here, the first input/output port 230 is the output port, and the second input/output port 240 is the input port. The parallel data stored in the register 220 is outputted to the key input unit 300 through each output pin ($I/O_0$-$I/O_7$) of the first input/output port 230.

For example, as shown in FIG. 3, if the parallel data stored in the register 220 is '1111', '1111' is simultaneously outputted through each output pin ($I/O_0$-$I/O_7$) of the first input/output port 230 (see column A), and each input pin ($I/O_8$-$I/O_{15}$) of the second input/output port 240 has '0000' as an input (see column B).

As shown in FIG. 3, each key corresponds to one input pin and one output pin. When a user presses a key of the key input unit 300, the pressed key connects an output pin of the first input/output port 230, corresponding to the pressed key, to an input pin of the second input/output port 240, corresponding to the pressed key. Accordingly, when the output pin connects to the input pin, the signal outputted by the output pin is inputted to the input pin, causing the signal inputted to the input pin to change from '0000' to '1111'. When the input pin changes, the second input/output port 240 sends a signal to the first transistor 250 which causes it to output an interrupt signal to the controller 100.

For example, as shown in FIG. 3, when a key corresponding to output pin $I/O_0$ and input pin $I/O_9$ is pressed by a user, the output pin ($I/O_0$) connects to input pin $I/O_9$, causing parallel data '1111', outputted by output pin $I/O_0$, to be inputted to the input pin $I/O_9$. As shown in FIG. 3, the other output pins $I/O_1$-$I/O_7$ also output data '1111', but this data is not inputted to any of the other input pins $I/O_8$, $I/O_{10}$-$I/O_{15}$. Thus, parallel data as shown in column (C) of FIG. 3 is received by the second input/output port 240 and an interrupt signal is generated in response to the change of the received parallel data. The signals inputted to each input pin ($I/O_8$-$I/O_{15}$), namely the parallel data shown in column (C) of FIG. 3, are stored in the register 220 of the interface system 200.

In response to receiving the interrupt signal, the controller 100 accesses the register 220 of the interface system 200 by sending an address via the address line pins 101-103 and reads the parallel data stored in the register 220 (shown in column (C) of FIG. 3) by the interface 200 converting the stored parallel data to serial data and transmitting the converted serial data through the serial pin 105.

The controller 100, which has stored the parallel data of each input pin ($I/O_8$-$I/O_{15}$) previously stored in register 220 (shown in column (B) of FIG. 3), compares the stored previous parallel data with the newly read parallel data, and determines which input pin corresponds to the pressed key by determining which data has changed. In the example shown in FIG. 3, the controller will determine that the data for input pin $I/O_9$ has changed, and thus will determine that input pin $I/O_9$ corresponds to the pressed key.

The controller 100 then follows the following procedure to determine which output pin corresponds to the pressed key.

To determine which output pin corresponds to the pressed key, the controller 100 first changes the output data of the first output pin $I/O_0$ by sending a first serial data sequence to the register 220 via the serial pins 104, 105. The register 220 converts the first serial data sequence to parallel data, which is then output by first output pin $I/O_0$. The controller 100 then accesses the register 220, and reads the data from the register 220 corresponding to input pin $I/O_9$ to determine whether it has changed, by the register 220 converting the parallel data in the register 220 to serial data and transmitting the serial data to the controller 100 via serial pin 105. If it has changed, the controller 100 determines that first output pin $I/O_0$ is connected to input pin $I/O_9$.

However, if the controller 100 determines that the data from the register 220 corresponding to input pin $I/O_9$ has not changed, the controller 100 then changes the output data of the second output pin $I/O_1$ by sending a second serial data sequence to the register 220. The controller 100 then accesses the register 220, and reads the data from the register 220 corresponding to input pin $I/O_9$ to determine whether it has changed. If it has changed, the controller 100 determines that second output pin $I/O_1$ is connected to input pin $I/O_9$.

Otherwise, the controller 100 repeats this procedure for each of the remaining output pins $I/O_2$-$I/O_7$, until it finds the output pin which is connected to input pin $I/O_9$.

Once the controller 100 has determined the input pin and the output pin which correspond to the pressed key (in the above example, output pin $I/O_0$ and input pin $I/O_9$), the controller 100 can determine the identity of the key and the function it is associated with. For example, the controller 100 can refer to a look-up table, which may associate the output pin $I/O_0$/input pin $I/O_9$ combination with a '5' button, for example.

Since the interface allows the controller to decode a key press using the address line pins, the serial data pins and the interrupt pin, a large number of input keys may be decoded with a small number of controller pins. For example, considering the 8×8 key input unit described in the above example, the controller only uses six pins (three address pins, two serial data pins, one interrupt pin) to decode a key press, whereas a conventional controller would require sixteen pins to decode the same key input unit.

The apparatus described above may be used in any electronic device which utilizes key input units in which keys are arranged in a matrix format. However, the described apparatus is particularly useful in small devices which include a large number of keys, such as mobile terminals having a keyboard.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

In an embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

Although the present specification describes components and functions that may be implemented in particular embodiments with reference to particular standards and protocols, the invention is not limited to such standards and protocols. Each of the standards, protocols and languages represent examples of the state of the art. Such standards are periodically superseded by faster or more efficient equivalents having essentially the same functions. Accordingly, replacement standards and protocols having the same or similar functions are considered equivalents thereof.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Accordingly, the disclosure and the figures are to be regarded as illustrative rather than restrictive.

One or more embodiments of the disclosure may be referred to herein, individually and/or collectively, by the term "invention" merely for convenience and without intending to voluntarily limit the scope of this application to any particular invention or inventive concept. Moreover, although specific embodiments have been illustrated and described herein, it should be appreciated that any subsequent arrangement designed to achieve the same or similar purpose may be substituted for the specific embodiments shown. This disclosure is intended to cover any and all subsequent adaptations or variations of various embodiments. Combinations of the above embodiments, and other embodiments not specifically described herein, will be apparent to those of skill in the art upon reviewing the description.

The above disclosed subject matter is to be considered illustrative, and not restrictive, and the appended claims are intended to cover all such modifications, enhancements, and other embodiments which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

Although the invention has been described with reference to several exemplary embodiments, it is understood that the words that have been used are words of description and illustration, rather than words of limitation. As the present invention may be embodied in several forms without departing from the spirit or essential characteristics thereof, it should also be understood that the above-described embodiments are not limited by any of the details of the foregoing description, unless otherwise specified. Rather, the above-described embodiments should be construed broadly within the spirit and scope of the present invention as defined in the appended claims. Therefore, changes may be made within the metes and bounds of the appended claims, as presently stated and as amended, without departing from the scope and spirit of the invention in its aspects.

What is claimed is:

1. An apparatus for decoding a key press, comprising:

an interface that performs conversion between parallel data and serial data and generates an interrupt when a key is pressed, the interface comprising an output port, an input port, and a register;

a key input unit, comprising a plurality of keys, that connects the output port to the input port; and a controller that determines which of the plurality of keys is pressed by receiving an interrupt signal from the interface via an interrupt pin, selecting addresses of the register via a plurality of address pins, and receiving serial data corresponding to the selected addresses from the interface via a data pin.

2. The apparatus according to claim 1, wherein the register stores serial data received from the controller as parallel data at an address designated by the controller via the plurality of address pins, and converts parallel data into serial data under the control of the controller, the output port outputs parallel data from the register to the key input unit, the input port inputs parallel data from the key input unit to the register, and the interface comprises a first transistor that generates the interrupt signal when one of the plurality of keys is pressed.

3. The apparatus according to claim 2, wherein the first transistor generates the interrupt signal in response to a change of parallel data received by the input port from the key input unit.

4. The apparatus according to claim 2, further comprising:

an input filter that filters serial data transmitted from the controller and transmits it to the register;

a second transistor that transmits serial data read from the register to the controller; and a power controller that turns power of the interface system on and off, and resets the interface system.

5. The apparatus according to claim 1, wherein the output port and the input port are input/output ports.

6. The apparatus according to claim 1, wherein the controller transmits and receives serial data to and from the interface according to one of an Inter-Integrated Circuit standard, a micro-WIRE standard and another serial communication method.

7. The apparatus according to claim 1, wherein parallel data is inputted to the register via the input port when the key is pressed and converted to serial data, and when the controller receives the interrupt signal, the controller accesses the register of the interface via the plurality of address pins, reads the converted serial data via the data pin, and compares the read serial data with previously stored serial data to thereby determine which input pin of a plurality of input pins of the input port connects to the pressed key.

8. The apparatus according to claim 7, wherein the controller determines which output pin of a plurality of output pins of the output port connects to the pressed key by repeating a sequence comprising causing the register to output a data sequence to one output pin of the plurality of output pins at a time, reading serial data converted from parallel data input to the register via the input port, and determining whether serial data has changed as a result of outputting the data sequence to the one output pin.

9. The apparatus according to claim 1, wherein the controller comprises a plurality of pins, consisting of three address pins, one or two data pins, and one interrupt pin.

10. The apparatus according to claim 1, wherein the interface comprises a chip.

11. The apparatus according to claim 1, wherein the key input unit comprises part of one of a mobile terminal, a telephone, a computer, and a portable music player.

12. A method for decoding a key press, comprising:

receiving, by a controller, an interrupt signal from an interface;

reading, by the controller, serial data from the interface via a data pin, in response to receiving the interrupt signal, by selecting addresses of a register of the interface via a plurality of address pins, and receiving serial data corresponding to the selected addresses via the data pin;

determining which input pin of a plurality of input pins is connected to a pressed key of a key input unit by comparing the read serial data with previously stored serial data; and determining which output pin of a plurality of output pins is connected to the pressed key of the key input unit by repeating a sequence comprising causing the interface to output a data sequence to one output pin of the plurality of output pins at a time.

13. The method according to claim 12, wherein the interface outputs the interrupt signal when a key of the key input unit is pressed.

14. The method according to claim 12, further comprising:

outputting, by the controller, initialization serial data via the data pin to the interface and an address through an address pin to the interface;

storing the initialization serial data as initialization parallel data in a register of the interface at a location corresponding to the address; and outputting the initialization parallel data to the key input unit through an output port.

15. The method of claim 12, wherein pressing a key of the key input unit connects an output pin of the plurality of output pins to an input pin of the plurality of input pins, thereby inputting parallel data output from the output pin to the input pin, and the interface sends the interrupt signal to the controller when new parallel data is inputted to the input pin.

16. The method of claim 12, wherein determining which output pin of a plurality of output pins is connected to the pressed key of the key input unit further comprises:

reading serial data converted from parallel data input to a register of the interface via the input pins, and determining whether serial data has changed as a result of outputting the data sequence to the one output pin.

17. The method of claim 12, wherein the controller transmits and receives serial data to and from the interface according to one of an Inter-Integrated Circuit standard, a micro-WIRE standard and another serial communication method.

18. The method according to claim 12, wherein the interrupt signal indicates to the controller that a key has been pressed.

19. The method according to claim 12, wherein the interface comprises a chip.

20. The method according to claim 12, wherein the key input unit comprises part of one of a mobile terminal, a telephone, a computer, and a portable music player.

21. An apparatus for decoding a key press, comprising:

an interface, comprising a register, that performs conversion between parallel data and serial data;

a key input unit, comprising a plurality of keys; and a controller that determines which of the plurality of keys is pressed, wherein the interface exchanges serial data with the controller in response to the controller selecting addresses of the register via a plurality of address pins, and exchanges parallel data with the key input unit.

22. The apparatus according to claim 21, wherein the register stores serial data received from the controller as parallel data, and stores parallel data received from the key input unit.

23. The apparatus according to claim 21, wherein the interface generates an interrupt signal and transmits the interrupt signal to the controller when a key is pressed.

24. The apparatus according to claim 23, wherein the controller determines which of the plurality of keys is pressed in response to receiving the interrupt signal from the interface.

25. A method for decoding a key press, comprising:

receiving, by an interface, parallel data from a key input unit;

converting the parallel data to serial data;

selecting addresses of a register of the interface via a plurality of address pins;

transmitting serial data corresponding to the selected addresses to a controller; and determining, by the controller, which key of a plurality of keys of the key input unit is pressed.

26. The method according to claim 25, further comprising storing the parallel data received from the key input unit in the register, converting serial data transmitted by the controller to the interface to parallel data, and storing the converted parallel data in the register.

27. The method according to claim 25, further comprising generating, by the interface, an interrupt signal and transmitting the interrupt signal to the controller when a key is pressed.

28. The method according to claim 27, wherein the controller determines which of the plurality of keys is pressed in response to receiving the interrupt signal from the interface.

* * * * *